United States Patent
Wong et al.

(10) Patent No.: US 10,411,685 B2
(45) Date of Patent: Sep. 10, 2019

(54) CIRCUIT AND METHOD FOR DETECTING CURRENT ZERO-CROSSING POINT, AND CIRCUIT AND METHOD FOR DETECTING LOAD VOLTAGE

(71) Applicant: Joulwatt Technology (Hangzhou) Co. Ltd., Hangzhou (CN)

(72) Inventors: Pitleong Wong, Hangzhou (CN); Yang Lu, Hangzhou (CN); Yue Ji, Hangzhou (CN); Yuancheng Ren, Hangzhou (CN); Xunwei Zhou, Hangzhou (CN)

(73) Assignee: Joulwatt Technology (Hangzhou) Co., LTD, Hangzhou (CN)

( * ) Notice: Subject to any disclaimer, the term of this patent is extended or adjusted under 35 U.S.C. 154(b) by 0 days.

(21) Appl. No.: 15/612,998

(22) PCT Filed: Dec. 4, 2015

(86) PCT No.: PCT/CN2015/096469
§ 371 (c)(1),
(2) Date: Jun. 2, 2017

(87) PCT Pub. No.: WO2016/086897
PCT Pub. Date: Jun. 9, 2016

(65) Prior Publication Data
US 2017/0310313 A1    Oct. 26, 2017

(30) Foreign Application Priority Data
Dec. 4, 2014    (CN) .......................... 2014 1 0729856

(51) Int. Cl.
*H03K 5/1536*    (2006.01)
*H03K 5/24*    (2006.01)
(Continued)

(52) U.S. Cl.
CPC ......... *H03K 5/1536* (2013.01); *G01R 19/175* (2013.01); *H03K 5/2454* (2013.01);
(Continued)

(58) Field of Classification Search
CPC .. H03K 5/1536; H03K 5/2454; H03K 5/2463; H03K 17/133; H03K 17/68; G01R 19/175
(Continued)

(56) References Cited

U.S. PATENT DOCUMENTS 9,076,554 B1 *   7/2015   Zanchi ................. G11C 27/026
2004/0164787 A1 *   8/2004   Panhofer ............. H03K 17/166
                                                                                        327/541
(Continued)

*Primary Examiner* — Patrick C Chen
(74) *Attorney, Agent, or Firm* — Treasure IP Group, LLC

(57) ABSTRACT

A circuit and a method for detecting a current zero-crossing point, and a circuit and method for detecting a load voltage are disclosed. The circuit for detecting current zero-crossing point includes: a load power supply circuit (14), a voltage-dividing resistor (16), a transistor switch (15), a zero-crossing detection circuit (19); the load power supply circuit (14) includes: a load (11), a diode (13), and an inductor (12); one end of the load power supply circuit (14) is connected with the operating voltage input terminal, the other end of the load power supply circuit (14) is connected with a first end of the transistor switch (15) and a first end of the voltage-dividing resistor (16), a second end of the voltage-dividing resistor (16) and a second end of the transistor switch (15) are connected with the ground, the load voltage is controlled by the transistor switch (15), the voltage-dividing terminal of the voltage-dividing resistor (16) is connected to a signal input terminal of the zero-crossing detection circuit (19), the zero-crossing detection circuit (19) is used to determine whether the current of the diode (13) crosses zero to obtain the on time of the diode (13), and the circuit for detecting load voltage uses the on time of the diode (13) and the on time of the transistor switch (15) to (Continued)

obtain the load voltage. The circuits are simple, but with high detection efficiency and low cost.

18 Claims, 7 Drawing Sheets

(51) Int. Cl.
    *H03K 17/13*         (2006.01)
    *H03K 17/68*         (2006.01)
    *G01R 19/175*      (2006.01)
    *H05B 33/08*         (2006.01)

(52) U.S. Cl.
    CPC ......... *H03K 5/2463* (2013.01); *H03K 17/133* (2013.01); *H03K 17/68* (2013.01); *H05B 33/0815* (2013.01)

(58) Field of Classification Search
    USPC .......................................................... 327/79
    See application file for complete search history.

(56) References Cited

U.S. PATENT DOCUMENTS

| | | | |
|---|---|---|---|
| 2007/0182346 A1* | 8/2007 | Shteynberg | H05B 33/0815 315/308 |
| 2009/0184748 A1* | 7/2009 | Suzuki | G05F 1/569 327/513 |

\* cited by examiner

CIRCUIT AND METHOD FOR DETECTING CURRENT ZERO-CROSSING POINT, AND CIRCUIT AND METHOD FOR DETECTING LOAD VOLTAGE

CROSS-REFERENCE TO RELATED APPLICATION

This application claims the benefit of Chinese Patent Application No. 201410729856.2, filed on Dec. 4, 2014, which is incorporated herein by reference in its entirety.

BACKGROUND OF THE DISCLOSURE

Field of the Disclosure

The present disclosure relates to the technical field of circuit detection, more particularly, to a circuit and method for detecting current zero-crossing point, and a circuit and method for detecting load voltage.

Background of the Disclosure

With the rapid development of LED, designs of LED driving circuits are emerging endlessly. However, the current LED driving circuit is complex in terms of designs in functional aspects like output over-load and over-voltage protection. Common LED load detection circuit uses a transformer, which makes the circuit complex, with a large volume and high cost.

SUMMARY OF THE DISCLOSURE

The present disclosure provides a circuit and method for detecting current zero-crossing point, and a circuit and method for detecting load voltage, which can rapidly obtain load voltage and rapidly determines current zero-crossing point of a diode; the circuit volume is small, and cost is low.

In order to solve the above problem, embodiments of the present disclosure provide a circuit for detecting current zero-crossing point, wherein it includes: a load power supply circuit, a voltage-dividing resistor, a transistor switch, a zero-crossing detection circuit; the load power supply circuit includes a load, a diode, and an inductor; the load, the diode and the inductor are connected in series to form a ring circuit, one end of the load power supply circuit is connected to an operating voltage input terminal, the other end of the load power supply circuit is connected to a first terminal of the transistor switch and a first end of the voltage-diving resistor, a second end of the voltage-dividing resistor and a second end of the transistor switch are connected to the ground; the load voltage is controlled by the transistor switch, the voltage-dividing terminal of the voltage-dividing resistor is connected to the signal input terminal of the zero-crossing detection circuit, and the zero-crossing detection circuit is used to determine whether the diode current crosses zero.

In an alternative embodiment of the present disclosure, the zero-crossing detection circuit includes a signal input terminal, a sample and maintaining module, a second reference voltage module, and a second comparator, the sample and maintaining module is connected to the second reference voltage module, one end of the sample and maintaining module is connected to the signal input terminal; one end of the second reference voltage module is connected to the first input terminal of the second comparator, and the signal input terminal is used as the second input terminal of the second comparator.

In an alternative embodiment of the present disclosure, in the load power supply circuit, one end of the load, a cathode of the diode is connected to the operating voltage input terminal, and the other end of the load is connected to one end of the inductor; the other end of the inductor is connected to the anode of the diode and is connected to a first end of the transistor switch and a first end of the voltage-dividing resistor.

In an alternative embodiment of the present disclosure, the load power supply circuit includes: a transformer, a diode, and a load, one end of the load is connected to the cathode of the diode, the other end of the load is connected to one end of a secondary winding of the transformer, the other end of the secondary winding of the transformer is connected to the anode of the diode, one end of the primary winding of the transformer is connected to the operating voltage input terminal, and the other end of the primary winding of the transformer is connected to the first end of the transistor switch and the first end of the voltage-dividing resistor.

In an alternative embodiment of the present disclosure, in the load power supply circuit, one end of the load, one end of the inductor are connected to the operating voltage input terminal; the other end of the load is connected to the cathode of the diode, and the anode of the diode is connected to the other end of the inductor, and is connected to the first end of the transistor switch and the first end of the voltage-dividing resistor.

In an alternative embodiment of the present disclosure, the load is an LED.

In an alternative embodiment of the present disclosure, the load is connected in parallel with a second capacitor.

Embodiments of the present disclosure further provide a method for detecting current zero-crossing point corresponding to the circuit for detecting current zero-crossing point, including obtaining a voltage waveform at a voltage-dividing terminal of the voltage-dividing resistor using the voltage-dividing resistor;

when the transistor switch is turned off and the diode is turned on, sampling and maintaining the voltage of the voltage-dividing terminal of the voltage-dividing resistor, comparing a result obtained by subtracting the voltage by a reference voltage with the voltage at the voltage-dividing terminal of the voltage-dividing resistor obtained in real time; when an instantaneous voltage of the voltage of the voltage-dividing terminal obtained in real time is lower than a result obtained by subtracting the voltage at the voltage-dividing terminal by the reference voltage, determining the current zero-crossing point of the diode.

In an alternative embodiment, the reference voltage is provided by the second reference voltage module.

Embodiments of the present disclosure further provide a circuit for detecting load voltage, wherein it comprises: a load power supply circuit, a voltage-dividing resistor, a transistor switch, a voltage detection circuit, and zero-crossing detection circuit; the load power supply circuit comprise a load, a diode, and an inductor, and the load, the diode and the inductor are connected in series to form a ring circuit; one end of the load power supply circuit is connected to an operating voltage input terminal, and the other end of the load power supply circuit is connected to a first end of the transistor switch and a first end of the voltage-dividing resistor; the second end of the voltage-dividing resistor and a second end of the transistor switch are connected to the ground; the load voltage is controlled by the transistor switch, and the voltage-dividing terminal of the voltage-dividing resistor is connected to a signal input terminal of the voltage detection circuit and the signal input terminal of the zero-crossing detection circuit, the zero-crossing detection circuit s used to determine whether the diode current crosses zero and to obtain the on time of the diode, the voltage detection circuit obtains the load voltage by use of the voltage sampled and maintained at the voltage-dividing terminal, the on time of the transistor switch and the on time of the diode.

In an alternative embodiment of the present disclosure, the voltage detection circuit includes a first signal input terminal, a second signal input terminal, a sampling and maintaining module, a voltage selection module and an average module; the first signal input terminal is connected to one end of the sampling and maintaining module, to sample and maintain the voltage at the voltage-dividing terminal, the other end of the sampling and maintaining module is connected to a first end of the voltage selection module; a second end of the voltage selection module is connected to the ground, and the second signal input terminal is connected to the voltage selection module for receiving the on time of the diode and on time of the transistor switch; a selection terminal of the voltage selection module is connected to one end of the average module; the average module averages the input signals during the on time of the transistor switch and the on time of the diode, and an average value output is the load voltage.

In an alternative embodiment of the present disclosure, the zero-crossing detection circuit comprises a signal input terminal, a sampling and maintaining module, a second reference voltage module and a second comparator; the sampling and maintaining module is connected to the second reference voltage module, and one end of the sampling and maintaining module is connected to the signal input terminal; end of the second reference voltage module is used as a first input terminal of the second comparator, and the signal input terminal is used as the second input terminal of the second comparator.

In an alternative embodiment, the circuit for detecting load voltage and the zero-crossing detection circuit share the sampling and maintaining module.

In an alternative embodiment of the present disclosure, the voltage detection circuit and the zero-crossing detection circuit are located in the load control circuit; when overvoltage of the load voltage is detected, the load control circuit controls a control terminal of the transistor switch to turn off the transistor switch.

In an alternative embodiment of the present disclosure, a first end of the transistor switch is connected to the other end of the load power supply circuit; a second end of the transistor switch is connected to the ground, and the control terminal of the transistor switch is connected to the load control circuit.

In an alternative embodiment of the present disclosure, in the load power supply circuit, one end of the load, a cathode of the diode are connected to the operating voltage input terminal; the other end of the load is connected to one end of the inductor, and the other end of the inductor is connected to an anode of the diode and is connected to the first end of the transistor switch and the first end of the voltage-dividing resistor.

In an alternative embodiment of the present disclosure, the load power supply circuit includes: a transformer, a diode, and a load; one end of the load is connected to the cathode of the diode, and the other end of the load is connected to one end of a secondary winding of the transformer; the other end of the secondary winding of the transformer is connected to the anode of the diode; one end of the primary winding of the transformer is connected to the operating voltage input terminal, and the other end of the primary winding of the transformer is connected to a first end of the transistor switch and a first end of the voltage-dividing resistor.

In an alternative embodiment of the present disclosure, in the load power supply circuit, one end of the load and one end of the inductor are connected to the operating voltage input terminal, and the other end of the load is connected to the cathode of the diode, and the anode of the diode is connected to the other end of the inductor, and is connected to the first end of the transistor switch and the first end of the voltage-dividing resistor.

In an alternative embodiment of the present disclosure, the load is an LED.

In an alternative embodiment of the present disclosure, the load is connected to the second capacitor in parallel.

Embodiments of the present disclosure further provide a method for detecting load voltage using the circuit for detecting load voltage, wherein it includes:

sampling voltage at a voltage-dividing terminal of a voltage-dividing resistor by using the voltage-dividing resistor;

when the transistor switch is turned off and the diode is turned on, sampling and maintaining the voltage of the voltage-dividing terminal of the voltage-dividing resistor; comparing a result obtained by subtracting the voltage by a reference voltage with a voltage of the voltage-dividing terminal of the voltage-dividing resistor obtained in real time, and when an instantaneous voltage of the voltage of the voltage-dividing terminal obtained in real time is lower the result obtained by subtracting the voltage of the voltage-dividing voltage by the reference voltage, determining if diode current crosses zero, so as to obtain on time of the diode;

after obtaining the on time of the diode, obtaining the load voltage by using the voltage sampling and maintaining at the voltage-dividing terminal, the on time of the transistor switch and the on time of the diode.

In an alternative embodiments of the present disclosure, during the on time of the transistor switch, the voltage sampled and maintained at the voltage-dividing terminal in the previous period is sampled when the diode is turned on, and during the on time of the diode, 0V voltage is sampled, the sampling voltages during the two times periods is averaged, and the average value is the load voltage.

Compared with the prior art, the technical solutions have the following advantages.

In the technical solutions of the present disclosure, after voltage-dividing by the voltage-dividing resistor, the current zero-crossing point of the diode can be easily detected by the zero-crossing detection circuit so as to obtain the on time of the diode. The detection efficiency is high, and the cost is low.

Meanwhile, the present technical solutions firstly use the zero-crossing detection circuit to detect the current zero-crossing point of the diode and obtain the on time of the diode, then use the circuit for detecting load voltage to calculate the load voltage by use of the sampling and maintaining voltage of the voltage-dividing terminal, the on time of the transistor switch and the on time of the diode. The circuits have simple structures but with high detection efficiency and low cost.

DETAILED DESCRIPTION OF THE DISCLOSURE

The following will describe the technical solutions of the present disclosure clearly and completely by specific embodiments by combining the accompanying drawings.

Figure 1:
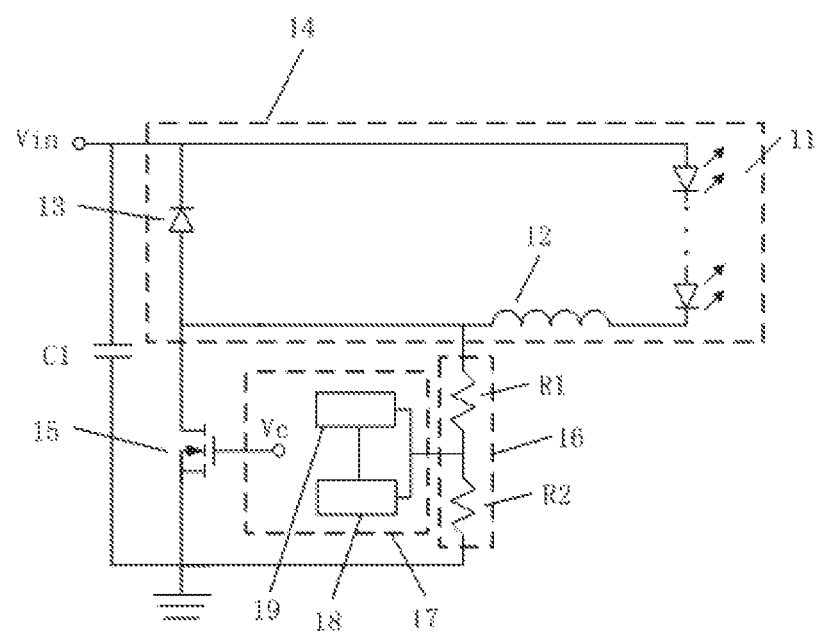
FIG. 1 is a structural schematic view of the circuit for detecting load voltage according to a first embodiment of the present disclosure.

Refer to FIG. 1, it is a circuit for detecting load voltage according to embodiment of the present disclosure, including: a load power supply circuit 14, a voltage-dividing resistor 16, a transistor switch 15, a voltage detection circuit 18, and a zero-crossing detection 19; the load power supply circuit 14 includes a load 11, a diode 13, and an inductor 12, and the load 11, the diode 13 and the inductor 12 are connected in series to form a ring circuit; one end of the load power supply circuit 14 is connected to an operating voltage input terminal Vin, and the other end of the load power supply circuit 14 is connected to a first end of the transistor switch 15 and a first end of the voltage-dividing resistor 16; a second end of the voltage-dividing resistor 16 and a second end of the transistor switch 15 are connected to the ground, and the load voltage is controlled by the transistor switch 15; the voltage-dividing end of the voltage-dividing resistor 16 is connected to the signal input terminal of the voltage detection circuit 18 and the signal input terminal of the zero-crossing detection circuit 19. Whether the current of the diode crosses zero determined by the zero-crossing detection circuit 19, and the on time of the diode is obtained, and the voltage detection circuit 18 acquires feedback voltage of the voltage-dividing terminal of the voltage-dividing resistor 16 by sampling and maintaining, and obtains the load voltage by calculating using the on time of the transistor switch and the on time of the diode.

In this embodiment, the load power supply circuit 14 includes a diode 13, an inductor 12, and a load 11; one end of load 11, a cathode of diode 13 are connected to the operating voltage input terminal Vin, and the other end of load 11 is connected to one end of inductor 12; the other end of inductor 12 is connected to the anode of diode 13, and is connected to a first end of transistor switch 15 and a first end of the voltage-dividing resistor 16.

In this embodiment, load 11 is an LED. Moreover, the directions of diode 13 and the LED are identical.

In other embodiments, the load may be other electronic devices, and the voltage of the load is detected by use of the voltage detection circuit.

A first capacitor C1 is connected to between the operating voltage input terminal Vin and the ground, and the first capacitor is to keep the stability of the operating voltage. In other embodiments, the two ends of the LED are further connected to a second capacitor, which is used for filtering the load current.

A first end of the transistor switch 15 is connected to the other end of the load power supply circuit 14, and a second end of the transistor switch 15 is connected to the ground; a control terminal of the transistor switch 15 is connected to the load control circuit 17.

In this embodiment, the transistor switch is an MOS transistor. In other embodiments, the transistor switch may be triode, etc.

In this embodiment, the voltage-dividing resistor 16 includes a first voltage-dividing resistor R1 and a second voltage-dividing resistor R2, and the first voltage-dividing resistor R1 and the second voltage-dividing resistor R2 are used to divide the voltage of the first end of transistor switch 15; the voltage-dividing end between the first voltage-dividing resistor R1 and the second voltage-dividing resistor R2 is connected to the signal input terminal of the zero-crossing detection circuit 19 and the first signal input terminal of the voltage detection circuit 18.

In other embodiments, the voltage-dividing resistor may also be a resistor, and the voltage-dividing end of the voltage-dividing resistor is connected to the signal input terminal of the zero-crossing detection circuit and the first signal input terminal of the voltage detection circuit.

Figure 2:
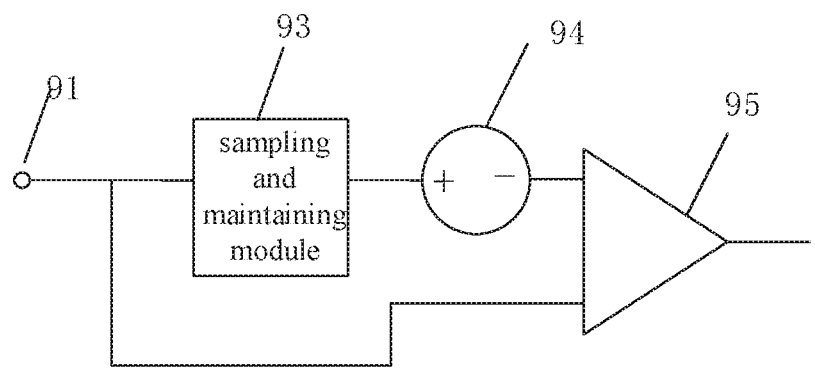
FIG. 2 is a structural schematic view of the zero-crossing detection circuit according to the embodiment of the present disclosure.

In this embodiment, referring to FIG. 2, the zero-crossing detection circuit 19 includes a signal input terminal 91, a sampling and maintaining module 93, a second reference voltage module 94, and a second comparator 95; the sampling and maintaining module 93 is connected to the second reference voltage module 94, and one end of the sampling and maintaining module 93 is connected to the signal input terminal 91; one end of the second reference voltage module 94 is used as the first input terminal of the second comparator 95, and the signal input terminal 91 is used as the second input terminal of the second comparator 95.

After the transistor switch is turned off and the diode is turned on, the sampling and maintaining module 93 samples and maintains feedback voltage $V_{FB}$ of the voltage terminal obtained at the signal input terminal 91, to obtain the sampling and maintaining voltage $V_{FBS}$, and by voltage V1 of the second reference voltage module 94, making the voltage of the first input terminal of the second comparator 95 be $V_{FBS}$-V1, and compares $V_{FBS}$-V1, with real-time voltage of the feedback voltage $V_{FB}$ of the voltage-dividing terminal. When the instantaneous voltage of $V_{FB}$ is lower than $V_{FBS}$-V1, the second comparator 95 is turned over, then it is determined that the diode current crosses zero.

The current zero-crossing point of the diode can be easily obtained by the zero-crossing detection circuit 19, so as to obtain the on time of the diode. The zero-crossing detection circuit 19 may form a circuit for detecting current zero-crossing point independently with the load power supply circuit 14, a voltage-dividing resistor 16, and a transistor switch 15, to detect the current zero-crossing point of the diode. However, in this embodiment, after the zero-crossing detection circuit 19 obtains the on time of the diode, the circuit for detecting load voltage 18 may easily get the load voltage by use of the on time of the diode and on time of the transistor switch.

Figure 3:
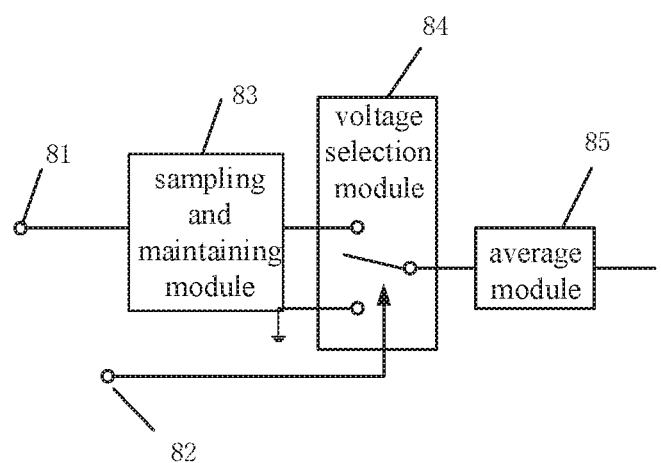
FIG. 3 is a structural schematic view of the voltage detection circuit according to the embodiment of the present disclosure.

In this embodiment, please referring to FIG. 3, the voltage detection circuit 18 includes a first signal input terminal 81, a second signal input terminal 82, a sampling and maintaining module 83, a voltage selection module 84, and an average module 85; the first signal input terminal 81 is connected to one end of the sampling and maintaining module 83, to sample and maintain the voltage at the voltage-dividing terminal of the voltage-dividing resistor; the other end of the sampling and maintaining module 83 is connected to a first terminal of the voltage selection module 84, and a second end of the voltage selection module 84 is connected to the ground, i.e., 0V; the second signal input terminal 82 is connected to the voltage selection module 84, for receiving the on time of the diode and on time of the transistor switch; the selection terminal of the voltage selection module 84 is connected to one end of the average module 85, and the average module 85 averages the input signals during the on time of the transistor switch and on time of the diode. During the on time of the transistor switch, the selection terminal of the voltage selection module 84 is connected to a first end of the voltage selection module 84, to average the voltage sampled and maintained at the voltage-dividing terminal; during the on time of the diode, the selection terminal of the voltage selection module 84 is connected to a second end of the voltage selection module 84, to average 0V voltage, and the output average value is the load voltage.

Figure 4:
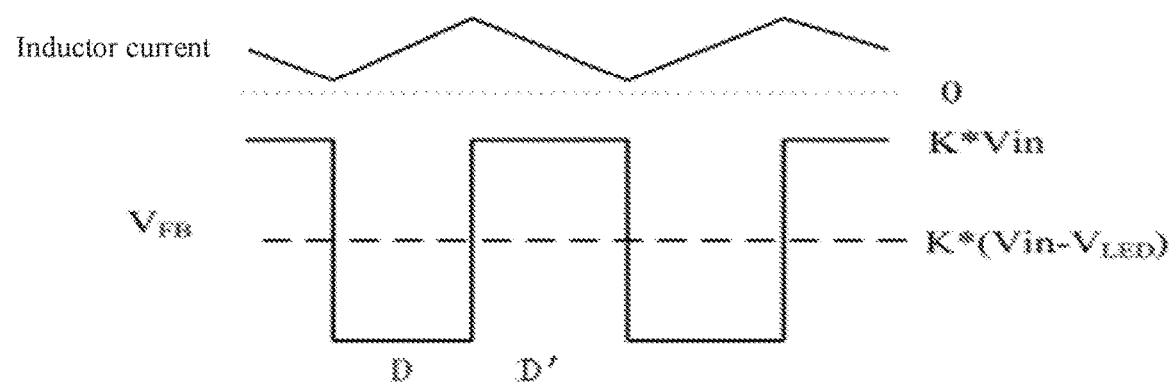
FIGS. 4 and 5 are the voltage and current waveform view of the embodiment according to the present disclosure.

When the circuit operates in a continuous current mode or a critical continuous current mode, wherein the continuous current mode refers to during the freewheeling period of the diode, when the inductor current reduces and not yet reaches zero, the next switch period starts, so the inductor current is always kept as a positive value. The critical continuous current mode refers to during the freewheeling period of the diode, when the inductor current falls to zero, the next switch period immediately starts, so the inductor current has a point of zero in each period. The waveform of the feedback voltage $V_{FB}$ at the voltage-dividing terminal is as shown FIG. 4, wherein, K=R2/(R1+R2). When the transistor switch is turned on, $V_{FB}$=0; when the transistor switch is turned off and the inductor current is a positive value, the diode is turned on, the on voltage reduction of the diode is omitted, and $V_{FB}$=K*Vin. The on time ratio of the transistor switch is ID, and the on time ratio of the diode is D'=(1-D).

Figure 5:
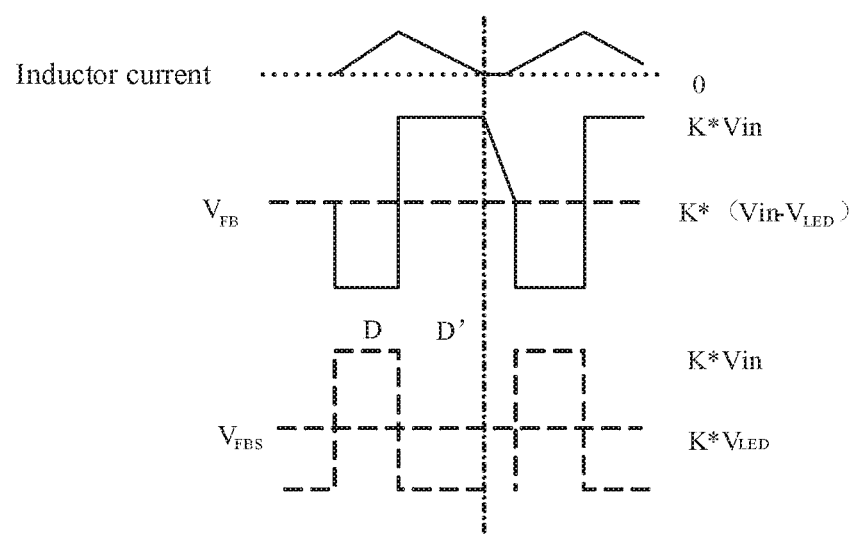

When the circuit operates in the discontinued current mode, the discontinued current mode refers to that during the freewheeling period of the diode, the inductor current is reduced to zero, and after a certain time period, the next switch period starts, so the inductor current is zero for a time period in each period, and the waveform of the feedback voltage $V_{FB}$ of the voltage-diving terminal is as shown in FIG. 5. When the transistor switch is turned off, and the inductor current is a positive value, the diode is turned on, and the on voltage reduction of the diode is omitted, wherein $V_{FB}$=K*Vin; during the on time of the diode, the inductor current reduces gradually, and when the induction current is falls to zero, the diode is automatically turned off, and the voltage of the first end of the transistor switch is reduced, the feedback voltage $V_{FB}$ of the voltage-diving terminal and the voltage of the first end of the transistor switch reduced in proportion, and the feedback voltage $V_{FB}$ of the voltage-dividing terminal is lower than the voltage when the diode is turned on, it is determined that the inductor current crosses zero.

In this embodiment, the sample and maintaining module 83 samples and maintains the voltage of the voltage-dividing terminal when the diode is turned on in the previous period; during the on time of the transistor switch, the selection terminal of the voltage selection module 84 is connected to a first end of the voltage selection module 84, to average the voltage sampled and maintained at the voltage-dividing terminal, and during the on time of the diode, the selection terminal of the voltage selection module 84 is connected to a second end of the voltage selection module 84, to average 0V voltage, corresponding to reconstructing a dot line waveform of $V_{FBS}$ according to the feedback voltage $V_{FB}$ of the voltage-dividing terminal in FIG. 5 (referring to FIG. 5). When the transistor switch 15 is turned on, the dot line waveform voltage is the feedback voltage $V_{FB}$ of the voltage-dividing terminal when the diode is turned on in the previous period, i.e., K*Vin. In other time, the dot line waveform voltage is connected to the ground, and is zero. The dot line waveform is averaged during D and D' (D is on time ratio of the transistor switch, and D' is on time ratio of the diode), thus LED voltage is obtained, K*$V_{LED}$=K*Vin*D/(D+D'). For the continuing current mode or the critical continuing current mode, D'=(1-D); for the discontinuing current mode, D'<(1-D), during the time when the transistor switch and the diode are not turned on, the average module does not perform the averaging.

In this embodiment, the zero-crossing detection circuit 19 and the voltage detection circuit 18 are in the same load control circuit 17 or a control chip, and the load control circuit 17 or the control chip is used for obtaining the on time of the diode and the on time of the transistor switch; meanwhile, when overvoltage of the load voltage is detected, the transistor switch 15 is turned off by the control terminal Vc of the transistor switch.

The voltage detection circuit 18 and the zero-crossing detection circuit 19 both use the same sampling and maintaining module or use different sampling and maintaining module.

In this embodiment, the control terminal of the zero-crossing detection circuit 19, the voltage detection circuit 18 and the transistor switch 15 may also be in different control chips or the load control circuits.

Figure 6:
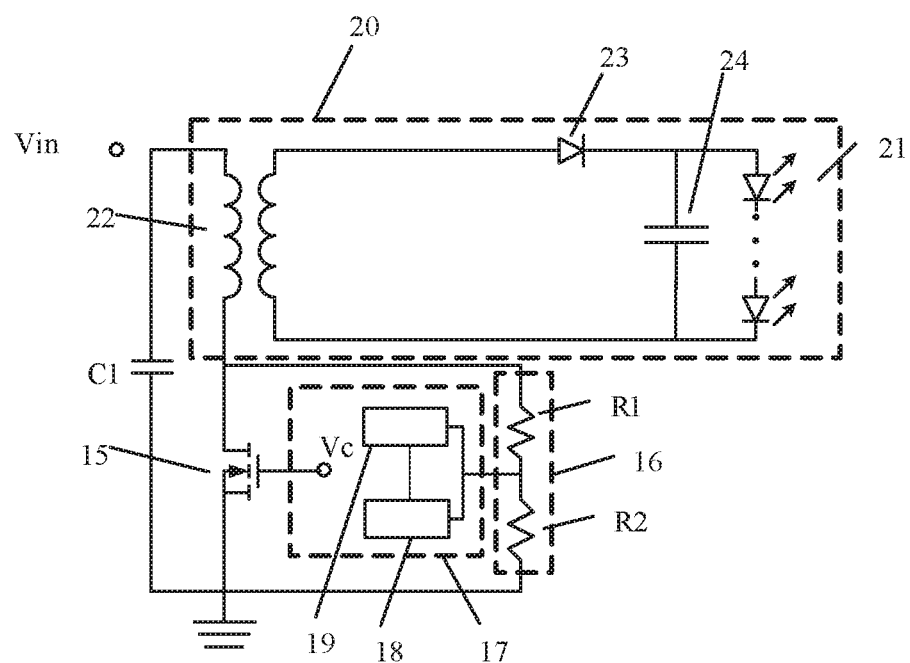
FIG. 6 is a structural schematic view of the circuit for detecting load voltage according to a second embodiment of the present disclosure.

The second embodiment of the present disclosure provides another circuit for detecting load voltage, referring to FIG. 6, the other parts are the same, only the load power supply circuit is different. The load power supply circuit 20 includes: a transformer 22, a diode 23, a second capacitor 24, and a load 21. The second capacitor 24 is connected to the load 21 in parallel, one end of the second capacitor 24 is connected to the cathode of the diode 23, and the other end of the second capacitor 24 is connected to one end of the secondary winding of the transformer 22, the other end of the secondary winding of the transformer 22 is connected with the anode of the diode 23, one end of the primary winding of the transformer 22 is connected to the operating voltage input terminal Vin, and the other end of the primary winding of the transformer 22 is connected to a first end of the transistor switch 15 and a first end of the voltage-dividing resistor 16.

The on time of transistor switch 15 is D, and the on time of diode 22 is D', the relationship between the two satisfies D*Vin=D'*n*Vo, Vo is the output voltage, i.e., LED voltage, n is a transformation ratio of transformer 22, the waveform at the first end of the transistor switch is reconstructed as voltage D (Vin+n*Vo), that is, the voltage of the first end of the transistor switch when the diode is turned on, and voltage is zero during period D', the voltage is averaged in period (D+D') to obtain D*(Vin+n*Vo)/(D+D')=n*Vo, i.e., the output load voltage.

In other embodiments, the two ends of the load may not be connected to the second capacitor in parallel.

Figure 7:
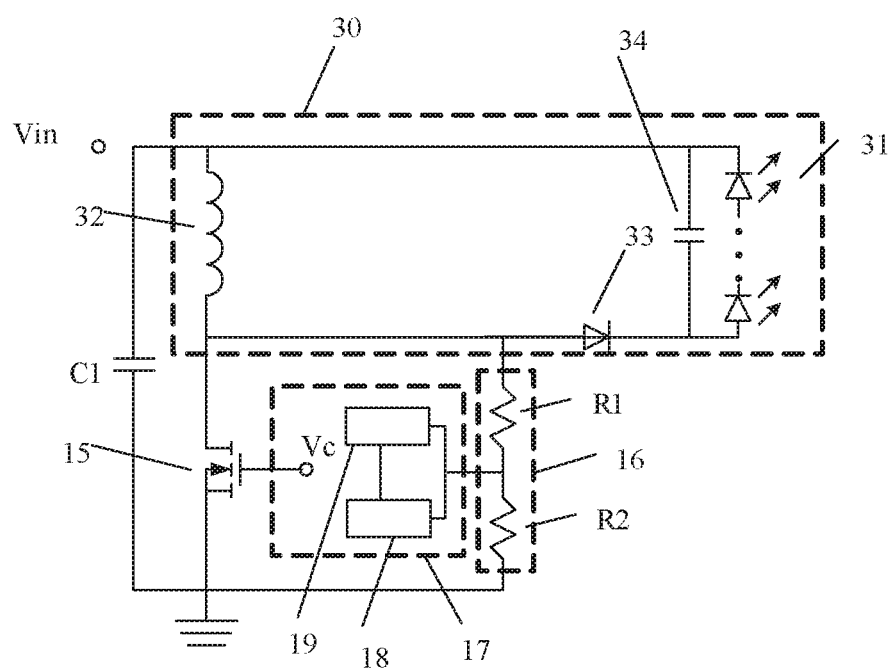
FIG. 7 is a structural schematic view of the circuit for detecting load voltage according to a third embodiment of the present disclosure.

The third embodiment of the present disclosure further provides another circuit for detecting load voltage. Please referring to FIG. 7, the other parts are the same, and merely the load power supply circuits are different. The load power supply circuit 30 includes: a diode 33, an inductor 32, a second capacitor 34, and a load 31. The load 31 is connected to the second capacitor 34 in parallel, One end of the load 31 and one end of the inductor 32 are connected to the operating voltage input terminal Vin, and the other end of the load 31 is connected to a cathode of diode 33. The anode of diode 33 is connected to the other end of inductor 32, and is connected to the first end of the transistor switch 15 and the first end of the voltage-dividing resistor 16.

The on time of the transistor switch 15 is D, and the on time of diode 22 is D', the relationship between the two satisfies D*Vin=D'*Vo; the waveform of the first end of the transistor switch 15 is reconstructed as the voltage (Vin+Vo), that is, the voltage of the first end of the transistor switch when the diode is turned on, and voltage at period D' is 0; the voltage is averaged in period (D+D') to obtain D*(Vin+Vo)/(D+D')=Vo, i.e., the output load voltage.

In other embodiments, the two end of the load may not be connected to the second capacitor in parallel.

Based on the above circuit, embodiments of the present disclosure first provide a method for detecting current zero-crossing point, including:

obtaining a voltage at a voltage-dividing terminal of a voltage-dividing resistor by the voltage-dividing resistor;

when the transistor switch is turned off and the diode is turned on, sampling and maintaining the voltage at the voltage-dividing terminal of the voltage-dividing resistor, comparing a result obtained by subtracting the voltage by a reference voltage with the voltage at the voltage-dividing terminal of the voltage-dividing resistor obtained in real time, and when an instantaneous voltage of the voltage-dividing terminal obtained in real time is lower than the result obtained by subtracting the voltage at the voltage-dividing terminal by a reference voltage, determining the diode current crosses zero and then the on time of the diode is obtained.

In addition, based on the above circuit for detecting load voltage, embodiments of the present disclosure further provide a method for detecting load voltage, comprising:

sampling voltage at the voltage-dividing terminal of the voltage-dividing resistor at the voltage-dividing resistor;

when the transistor switch is turned off and the diode is turned on, sampling and maintaining the voltage at the voltage-dividing terminal of the voltage-dividing resistor, comparing a result obtained by subtracting the voltage by a reference voltage with the voltage at the voltage-dividing terminal of the voltage-dividing resistor obtained in real time, when the instantaneous voltage of the voltage-dividing terminal obtained in real time is lower than the result obtained by subtracting the voltage at the voltage-dividing terminal by a reference voltage, determining the diode current crosses zero, so as to obtain the on time of the diode;

After the diode on time is obtained, using the sampling and maintaining voltage at the voltage-dividing terminal, the on time of the transistor switch and the on time of the diode, to calculate and obtain the load voltage.

In the first embodiment of the present invention, when the transistor switch 15 is turned on, the sampling and maintaining dot line waveform voltage is the feedback voltage $V_{FB}$ at the voltage terminal when the diode is turned on in the previous period, i.e., K*Vin. When the diode is turned on, the voltage selection module connects the output voltage to the ground, and the output voltage is adjusted to 0V, and the dot line waveform is averaged during D and D' (D is on time ratio of the transistor switch, and D' is on time ratio of the diode), and the LED voltage can be obtained, i.e., $K*V_{LED}=K*Vin*D/(D+D')$.

In the second embodiment of the present disclosure, the on time of transistor switch 15 is D, and on time of diode 22 is D', the relationship between the two satisfies D*Vin=D'*n*Vo, and the waveform of the first end of the transistor switch is reconstructed as voltage (Vin+n*Vo), i.e., the voltage at the first end of the transistor switch when the diode is turned on during period D, and voltage is 0 at period D'; the voltage is averaged within time (D+D') to obtain D*(Vin+n*Vo)/(D+D')=n*Vo, i.e., the output load voltage.

In the third embodiment of the present disclosure, the on time of transistor switch 15 is D, the on time of diode 22 is D', and the relationship between the two satisfy D*Vin=D'*Vo; the waveform of the first terminal of the transistor switch is reconstructed to be voltage (Vin+Vo), that is, the voltage of the first end of the transistor switch when the diode is turned on during period D, and voltage is 0 at period D'; the voltage is averaged in time (D+D') to get D*(Vin+Vo)/(D+D')=Vo, i.e., the output load voltage.

Though the present disclosure has been disclosed above by preferred embodiments, they are not intending to limit the present disclosure. Any of those skilled workers in the art may use the above disclosed methods and technical contents to make possible changes and modifications on the technical solution of the present invention without departing from the sprints and scope of the present disclosure. Therefore, any contents not departing from the technical solutions of the present disclosure, any simple amendments, equivalent changes and modifications made to the above embodiments according to the technical substances of the present disclosure, all belong to the protection scope of the technical solution of the present disclosure.

The invention claimed is:

1. A circuit for detecting a current zero-crossing point, comprising:

a load power supply circuit;
a voltage-dividing resistor;
a transistor switch; and
a zero-crossing detection circuit,
wherein said load power supply circuit comprises a load, a diode, and an inductor; said load, said diode and said inductor are connected in series to form a ring circuit, one end of said load power supply circuit is coupled to an operating voltage input terminal, the other end of said load power supply circuit is coupled to a first terminal of said transistor switch and a first end of said voltage-dividing resistor, a second end of said voltage-dividing resistor and a second end of said transistor switch are coupled to ground; a load voltage is controlled by said transistor switch, a voltage-dividing terminal of said voltage-dividing resistor is coupled to a signal input terminal of said zero-crossing detection circuit, and a current zero-crossing point of said diode is obtained by said zero-crossing detection circuit,
wherein by said zero-crossing detection circuit, a first voltage at said voltage-dividing terminal is sampled and maintained when said transistor switch is turned off and said diode is turned on, a result obtained by subtracting said first voltage by a reference voltage is compared with a second voltage at said voltage-dividing terminal obtained in real time, to determine that a diode current crosses zero in a case that said second voltage is smaller than said first voltage,
wherein said voltage-dividing resistor is configured to divide voltage of said first terminal of said transistor switch and provide a divided voltage at said voltage-dividing terminal.

2. The circuit for detecting the current zero-crossing point according to claim 1, wherein said zero-crossing detection circuit comprises a signal input terminal, a sample and maintaining module, a second reference voltage module, and a second comparator, wherein said sample and maintaining module is coupled to said second reference voltage module, one end of said sampling and maintaining module is coupled to said signal input terminal; one end of said second reference voltage module is used as a first input terminal of said second comparator, and said signal input terminal is used as a second input terminal of said second comparator.

3. The circuit for detecting the current zero-crossing point according to claim 1, wherein in said load power supply circuit, one end of said load and a cathode of said diode are coupled to said operating voltage input terminal, and the other end of said load is coupled to one end of said inductor; the other end of said inductor is coupled to an anode of said diode and is coupled to a first end of said transistor switch and a first end of said voltage-dividing resistor.

4. The circuit for detecting the current zero-crossing point according to claim 1, wherein in said load power supply circuit, one end of said load and one end of said inductor are coupled to said operating voltage input terminal; the other end of said load is coupled to a cathode of said diode, and an anode of said diode is coupled to the other end of said inductor, and is coupled to said first end of said transistor switch and said first end of said voltage-dividing resistor.

5. The circuit for detecting the current zero-crossing point according to claim 1, wherein said load is an LED.

6. The circuit for detecting the current zero-crossing point according to claim 1, wherein said load is connected in parallel with a second capacitor.

7. A method for detecting a current zero-crossing point by use of the circuit for detecting the current zero-crossing point according to claim 1, comprising:
   obtaining a first voltage at said voltage-dividing terminal of said voltage-dividing resistor;
   sampling and maintaining said first voltage at said voltage-dividing terminal of said voltage-dividing resistor when said transistor switch is turned off and said diode is turned on;
   comparing a result obtained by subtracting said first voltage by a reference voltage with a second voltage at said voltage-dividing terminal of said voltage-dividing resistor obtained in real time; and
   determining that a diode current crosses zero in a case that said second voltage is smaller than said first voltage.

8. The method for detecting the current zero-crossing point according to claim 7, wherein said reference voltage is provided by a second reference voltage module.

9. A circuit for detecting a load voltage, comprising:
   a load power supply circuit;
   a voltage-dividing resistor;
   a transistor switch;
   a voltage detection circuit; and
   a zero-crossing detection circuit,
   wherein said load power supply circuit comprises a load, a diode, and an inductor, and said load, said diode and said inductor are connected in series to form a ring circuit; one end of said load power supply circuit is coupled to an operating voltage input terminal, and the other end of said load power supply circuit is coupled to a first end of said transistor switch and a first end of a voltage-dividing resistor; a second end of said voltage-dividing resistor and a second end of said transistor switch are coupled to ground; a load voltage is controlled by said transistor switch, and a voltage-dividing terminal of said voltage-dividing resistor is coupled to a signal input terminal of said voltage detection circuit and to a signal input terminal of said zero-crossing detection circuit, said zero-crossing detection circuit is used to determine whether a diode current crosses zero and to obtain an on time of said diode; said voltage detection circuit obtains said load voltage by use of a first voltage sampled and maintained at said voltage-dividing terminal, said on time of said transistor switch and said on time of said diode,
   wherein by said zero-crossing detection circuit, a first voltage at said voltage-dividing terminal is sampled and maintained when said transistor switch is turned off and said diode is turned on, a result obtained by subtracting said first voltage by a reference voltage is compared with a second voltage at said voltage-dividing terminal obtained in real time, to determine that a diode current crosses zero in a case that said second voltage is smaller than said first voltage,
   wherein said voltage-dividing resistor is configured to divide voltage of said first terminal of said transistor switch and provide a divided voltage at said voltage-dividing terminal.

10. The circuit for detecting the load voltage according to claim 9, wherein said voltage detection circuit comprises a first signal input terminal, a second signal input terminal, a sampling and maintaining module, a voltage selection module and an average module; said first signal input terminal is coupled to one end of said sampling and maintaining module, to sample and maintain said voltage at said voltage-dividing terminal, the other end of said sampling and maintaining module is coupled to a first end of said voltage selection module; a second end of said voltage selection module is coupled to ground, and said second signal input terminal is coupled to said voltage selection module for receiving said on time of said diode and said on time of said transistor switch; a selection terminal of said voltage selection module is coupled to one end of said average module; said average module averages said input signals when said transistor switch is turned on and said diode is turned on, and outputs an average value as said load voltage.

11. The circuit for detecting the load voltage according to claim 9, wherein said zero-crossing detection circuit comprises a signal input terminal, a sampling and maintaining module, a second reference voltage module and a second comparator, wherein said sampling and maintaining module is coupled to said second reference voltage module, and one end of said sampling and maintaining module is coupled to said signal input terminal; one end of said second reference voltage module is used as a first input terminal of said second comparator, and said signal input terminal is used as said second input terminal of said second comparator.

12. The circuit for detecting the load voltage according to claim 9, wherein said circuit for detecting load voltage and said zero-crossing detection circuit share a sampling and maintaining module.

13. The circuit for detecting the load voltage according to claim 9, wherein said voltage detection circuit and said zero-crossing detection circuit are located in a load control circuit; when overvoltage of said load voltage is detected, said load control circuit controls a control terminal of said transistor switch to turn off said transistor switch.

14. The circuit for detecting the load voltage according to claim 13, wherein a first end of said transistor switch is coupled to the other end of said load power supply circuit;

a second end of said transistor switch is coupled to ground, and said control terminal of said transistor switch is coupled to said load control circuit.

15. The circuit for detecting the load voltage according to claim 9, wherein in said load power supply circuit, one end of said load, a cathode of said diode are coupled to said operating voltage input terminal; the other end of said load is coupled to one end of said inductor, and the other end of said inductor is coupled to an anode of said diode and is coupled to said first end of said transistor switch and said first end of said voltage-dividing resistor.

16. The circuit for detecting the load voltage according to claim 9, wherein in said load power supply circuit, one end of said load, and one end of said inductor are coupled to said operating voltage input end, and the other end of said load is coupled to a cathode of said diode, and an anode of said diode is coupled to the other end of said inductor, and is coupled to a first end of said transistor switch and a first end of said voltage-dividing resistor.

17. The circuit for detecting the load voltage according to claim 9, wherein said load is an LED.

18. The circuit for detecting the load voltage according to claim 9, wherein said load is connected to said second capacitor in parallel.

* * * * *